United States Patent [19]

Berg et al.

[11] 4,384,911
[45] May 24, 1983

[54] METHOD FOR DEPOSITING HARD FILM ON A SUBSTRATE

[75] Inventors: Joseph E. Berg; Randolph E. Brown, Jr., both of Los Angeles, Calif.

[73] Assignee: Precision Thin Film Corporation, Los Angeles, Calif.

[21] Appl. No.: 111,390

[22] Filed: Jan. 11, 1980

Related U.S. Application Data

[62] Division of Ser. No. 929,733, Jul. 31, 1978, Pat. No. 4,210,701, which is a division of Ser. No. 571,480, Apr. 24, 1975, Pat. No. 4,107,350, which is a division of Ser. No. 280,489, Aug. 14, 1972, Pat. No. 3,913,520.

[51] Int. Cl.³ .............................................. B32B 17/00
[52] U.S. Cl. ...................................... 156/99; 156/150; 156/242; 156/285; 156/298; 428/409; 428/410
[58] Field of Search ................... 357/91; 156/102, 390, 156/62.2, 99, 150, 242, 285, 298; 118/723, 640, 679, 620; 204/192 N, 192 P, 298; 427/38, 43.1, 40, 42, 36, 47; 428/409, 410

[56] References Cited

U.S. PATENT DOCUMENTS

| | | | |
|---|---|---|---|
| 3,117,022 | 1/1964 | Bronson et al. | 204/192 N |
| 3,192,892 | 7/1965 | Hanson et al. | 204/298 X |
| 3,371,649 | 3/1968 | Gowen | 118/723 |
| 3,409,529 | 11/1968 | Chopra et al. | 204/298 X |
| 3,428,546 | 2/1969 | Baum et al. | 204/298 |
| 3,472,751 | 10/1969 | King | 204/298 |
| 3,494,852 | 2/1970 | Doctoroff | 204/298 |
| 3,562,141 | 2/1971 | Morley | 204/298 |
| 3,913,520 | 10/1975 | Berg et al. | 427/38 X |
| 4,107,350 | 8/1978 | Berg et al. | 427/38 |
| 4,210,701 | 7/1980 | Berg et al. | 428/409 |

Primary Examiner—Marion McCamish
Attorney, Agent, or Firm—Henry M. Bissell

[57] ABSTRACT

Method and apparatus for using emitting, ionizing, accelerating and collecting elements in a high vacuum to implant a hard film on a plastic substrate or the like. In preparation, a slug of a selected material to be deposited as a film is placed in the emitter. The specimens or articles to be implanted are placed on supports in the vicinity of the collector. A cover enclosure is then placed in position and the region enclosed by the cover is exhausted to a high vacuum. Selected potentials are applied to various elements of the apparatus and an accelerating/directing field, which may be developed electrostatically, magnetically or by a combination of both, is developed in the acceleration structure. The electrostatic field causes electron emission from the ionizing elements to develop an increased charge on the emitted ionized particles. When implantation is to begin, a shutter control is moved out of beam blocking position and ionized particles from the emitter pick up additional charge from the ionizing elements and are accelerated to high velocity for bombarding the specimens. The collector is provided near the end of the enclosure beyond the specimen support region. The specimens are discharged regularly to eliminate the build-up of surface charge from the stream of bombarding ions.

7 Claims, 17 Drawing Figures

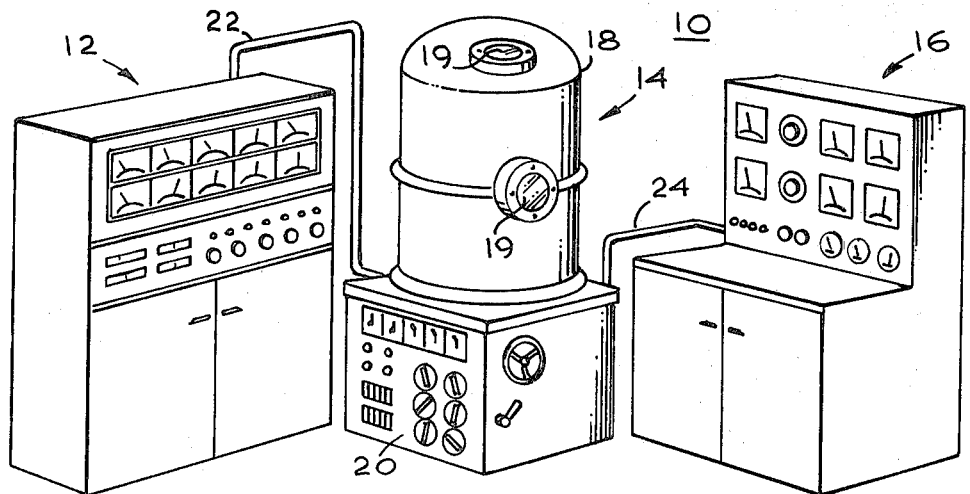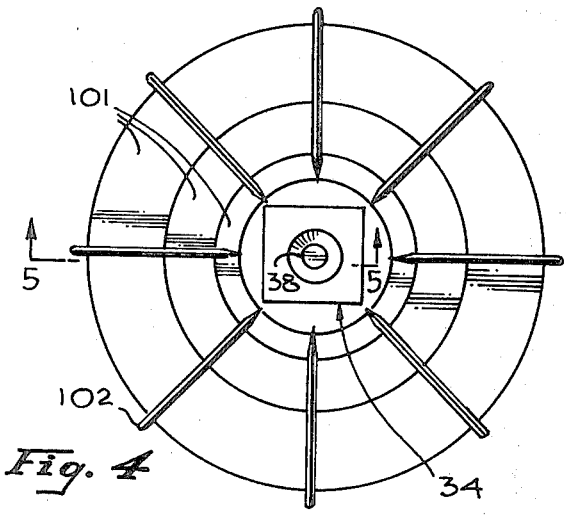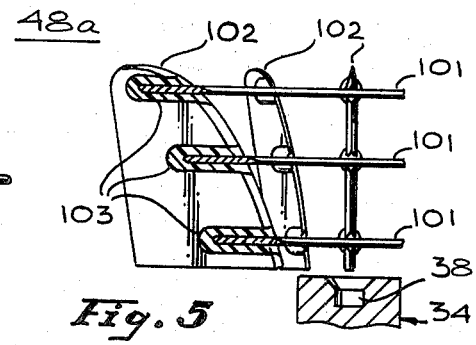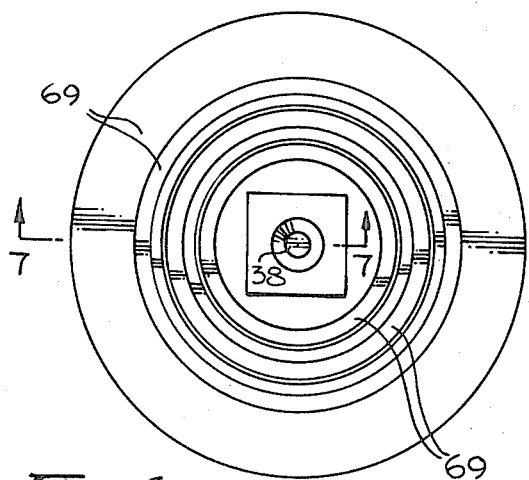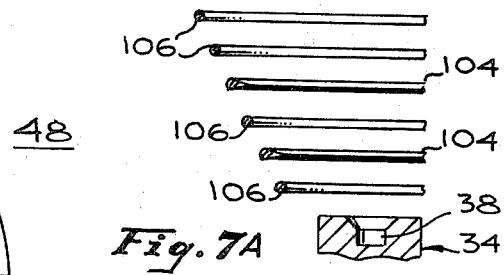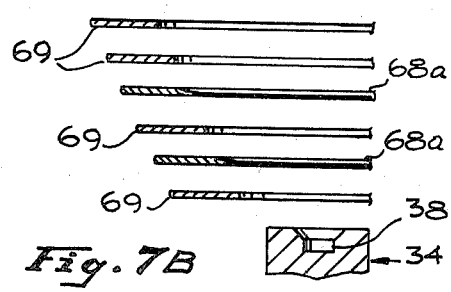

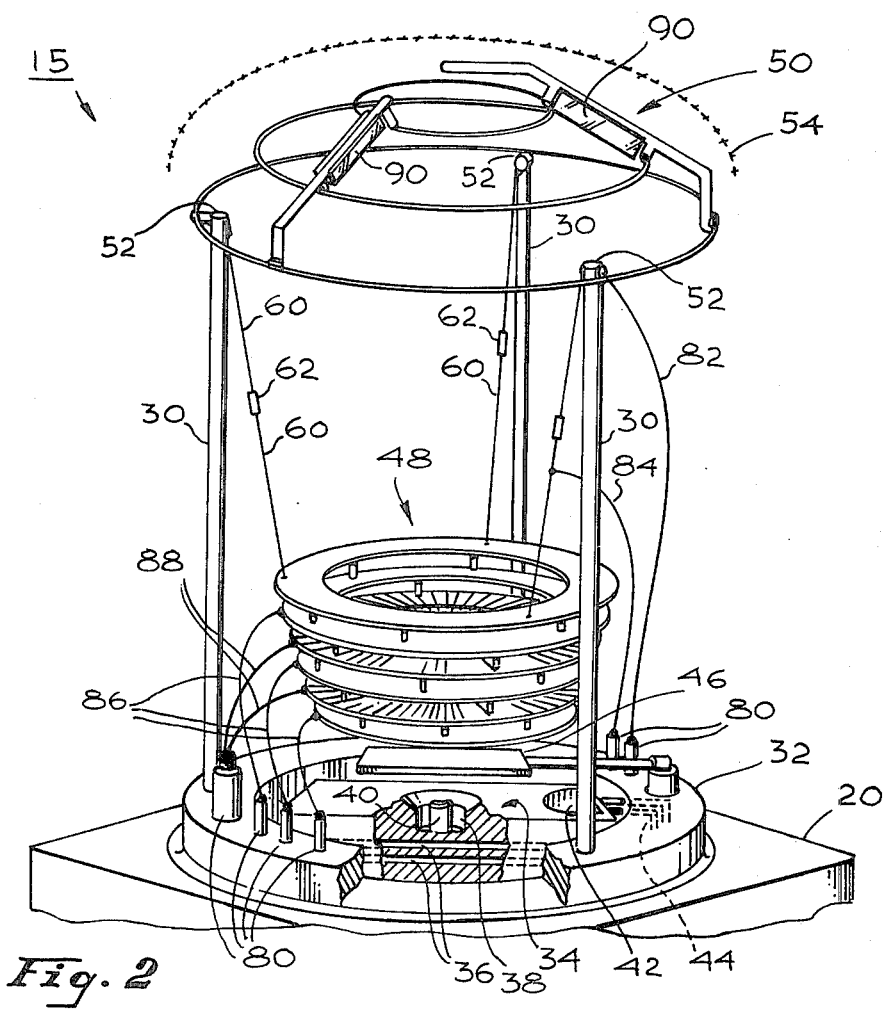
Fig. 2
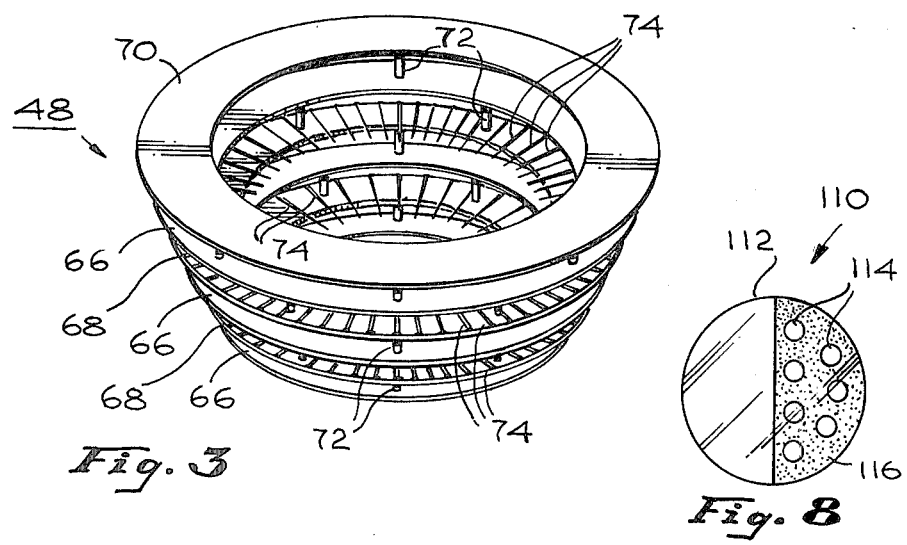
Fig. 3
Fig. 8

METHOD FOR DEPOSITING HARD FILM ON A SUBSTRATE

This is a division of application Ser. No. 929,733, filed July 31, 1978, now U.S. Pat. No. 4,210,701, which was a division of application Ser. No. 571,480, filed Apr. 24, 1975, now U.S. Pat. No. 4,107,350, which itself was a division of application Ser. No. 280,489, filed Aug. 14, 1972, now U.S. Pat. No. 3,913,520.

BACKGROUND OF THE INVENTION

1. Field of the Invention

This invention relates to film deposition methods and apparatus, and more particularly, to such apparatus and methods for depositing a thin transparent hard film on a substrate, the properties of which may be enhanced by transformation of its surface in such manner. The invention is particularly applicable to film implantation in plastics.

2. Description of the Prior Art

With the increasing use of plastic and other non-glass lenses in eyeglasses and other items, it has become increasingly important to develop hardened surfaces on such relatively soft materials which resist scratching and abrasion. This is particularly true since the recent introduction of laws requiring the discontinuance of glass lenses in all but a few types of eyeglasses. Various methods of developing such hardened surfaces have been employed, but with less than complete success. These methods include the dipping of plastic lenses, the wiping on of a film, the use of harder plastics themselves, the provision of a laminated lens and similar approaches. Ideally, of course, such a product should have the resilience of the better plastics for protection against impact from hard objects while having surfaces that are as effective as glass or more so in resisting scratching and abrasion.

Similarly the surface properties of many materials and objects may be enhanced by the provision of an extremely thin surface coating of a suitable material which may serve to protect the surface underneath from corrosion, wear and the like or provide a surface hardness not attainable by the substrate alone. Thus for example, razor blades which are said to suffer more from corrosion than wear, may be made to last many times longer than at present with suitable protection of the fine cutting edge from corrosion. If at the same time the cutting edge may be hardened, then the effects of wear will be reduced as well, both factors acting together to provide a much longer lasting blade.

In addition, surface alloys may be developed on metal substrates and surface layers of various dopings of impurities and the like to semiconductor substrates may be possible through the use of appropriate deposition and implantation techniques. The accomplishment of such developments would greatly economize on the use of rare and expensive materials where only surface effects are needed.

Efforts have been made to develop such products by particle bombardment. Examples of such may be found in U.S. Pat. Nos. 3,117,022 of G. A. Bronson et al, 3,494,852 of M. Doctoroff, 3,371,649 of H. E. T. Gowen, 3,409,529 of K. L. Chapra et al, 3,472,751 of W. J. King, 3,562,141 of J. R. Morley, and others. However, whether through ineffective focusing or direction of the beam, emission and control of the ionized particles or for whatever unknown reason, such approaches have not resulted in truly acceptable and satisfactory products which realized the potential of the theories underlying such bombardment techniques.

SUMMARY OF THE INVENTION

The invention is generally set forth in the abstract above, which is incorporated by reference. In brief, the invention comprises methods and apparatus for developing emission of ionized molecular particles of a selected material and further ionizing the particles and accelerating them in a predetermined path toward a collector region for implantation on a plastic or other substrate positioned in the vicinity of the collector region. The entire particle bombardment structure is positioned within a vacuum chamber during operation. Predetermined electrical potentials are maintained at the various elements of the structure employed in the apparatus. Either electrostatic or magnetic ion beam directing apparatus may be employed for beam control or some combination of the two systems may be utilized. An electrostatic field is required, however to develop electron emission from ionizing elements positioned adjacent the path of the beam so as to "super-ionize" the beam, thus permitting effective acceleration. The beam is directed over a sufficient extent and controlled to such a degree by apparatus in accordance with the invention as to permit bombardment of specimen substrate over a considerable area. Where the specimen substrate is non-conducting, provision is made for the dissipation of surface charge carried to the substrate by the bombarding ions. Those ionized particles which do not impact the specimen materials are caught on a collecting grid and removed from the system.

Material which has been successfully implanted in apparatus in accordance with the invention comprises minerals such as are set forth in the above-identified patents, selected for their properties of hardness, elasticity, heat resistance and optical clarity. The materials may include trace amounts of minute impurities such as may be found in commercial grade materials. In one example these materials are implanted onto various types of plastic lenses with implantation occurring to a depth of approximately 10,000 Angstroms (1 micron) within the preferred range from several hundred Angstroms to a few microns and the process of implanting and depositing continuing until the film layer is built up to a preferred thickness of approximately 2 microns. The result is an eyeglass lens or other product which has the shatter-resistance of the plastic substrate under the surface film with abrasion-resistant properties equal to or better than those of glass.

In one particular arrangement in accordance with the invention, an electron beam gun emitter was employed with a paste mixture of such known minerals selected for their properties of hardness, elasticity, heat resistance and optical clarity, positioned in the electron beam gun target region. This electron beam gun is water-cooled, has a filament for emitting electrons and utilizes electromagnetic fields to cause the emitted electron beam to curve and bombard the target material. As a result, the target material and its molecules are bombarded off the surface as ionized molecular particles where they become accelerated by the field of the particle accelerator. A removable shutter is positioned in the region between the emitter and the accelerator to block or pass the beam as desired.

The accelerator structure has interspersed ionizing elements which further ionize the molecular particles of the beam. This structure accelerates, directs and shapes the beam in its path to the specimen and collector region. In one particular arrangement of the invention, the accelerator structure comprises a series of spaced and insulated flat rings of varying diameters, increasing in the direction of beam traversal. Selected ones of these rings were fashioned as ionizing elements by silver soldering sharp needles with their points directed inward and generally equally spaced about the circumference of the rings. These sharp points serve as electron emitters for further ionizing particles as they pass through the rings. The accelerator structure is suspended from insulated wires extending to a support structure which also holds a target frame on which various lenses may be mounted. The collector screen extends over the specimen support brackets, physically and electrically separated therefrom, and is positioned across the divergent beam region so as to collect those particles that do not impact the specimens.

In operation, a bell jar type cover is placed over the entire structure and the region thus enclosed is evacuated to a high vacuum. The insulators and interconnecting conductors are arranged to develop various potentials at various elements of the structure. A DC power supply has been employed for developing these potentials with selected RF modulation of certain electrode elements being developed from an RF generator.

In one preferred arrangement in accordance with the invention, the electron beam gun emitter is maintained at the negative power supply voltage which is 10 kv. The first, third and fifth rings of the accelerator structure (counting from the bottom nearest the electron beam gun emitter) are preferably maintained at neutral potential, although these may have their potentials controlled, if desired, to exert minor control on the particle beam. The second and fourth rings are the ionizing elements with the needles attached. These are maintained at a negative potential range of approximately $-3,000$ to $-15,000$ volts, modulated with an RF signal of approximately 25 to 100 volts rms at 400 megahertz. The sixth and final ring is maintained at a slight positive potential, although this is not critical and this ring may be left to float and assume the potential of the beam, if desired. The specimen support frame is maintained at a positive 4 to 10 kilovolts. This can also be modulated with an RF signal at an amplitude of approximately 25 to 100 volts rms which serves to develop a controlled plasma that periodically discharges the plastic or other nonconducting material of the specimen substrate. The lenses or other products to be filmed are mounted in clips secured to the support frame. As an alternative to using a controlled plasma for discharging the substrate, isotope bodies may be mounted near the support frame for discharging the plastic substrate by radioactive bombardment. The collector screen is also maintained at a positive potential of from 4 to 10 kilovolts, thus providing a strong positive force drawing the negatively ionized beam particles toward the specimens being bombarded.

It has also been found possible to develop a beam which results in film deposition and implantation by reversing the polarity of potentials applied to the various elements of the structure. In such event, of course, the effectiveness of the ionizing elements is limited but the accelerating, beam shaping and directing, and collecting elements operate with positive ions essentially as described for negatively ionized particles.

In alternative embodiments of the invention, various types and configurations of accelerating and ionizing structures may be employed. One such structure utilizes a series of vertical vanes fixed to the various horizontal rings by insulator mounts. The vanes are preferably of stainless steel and fashioned with all surfaces made extremely smooth, as by electropolishing, except the inner edge which is sharpened to an extreme degree. As explained previously, the succeeding rings increase in diameter and the vanes are angled along their inner sharp edges to match the gradient of ring inner diameter. The shape of such accelerating vanes influences the rate of acceleration of the beam particles. It may also be related to the shape of the specimen being coated. The shape of the beam may be varied by using rings which are elliptical or which present other shapes rather than circular.

Still another alternative arrangement of the accelerating ionizing structure may utilize the stacked rings as first described but with the ion emitting rings being fashioned with extremely sharp inner edges instead of having the needles mounted thereon as heretofore described. Still another embodiment may utilize a series of tubular rings with the accelerating rings being rounded and polished while the electron emitter (ionizing) tubular elements are provided with a radially inward knife edge.

The potentials applied to the various elements of the accelerating structure may be stepped and varied as desired. A varying effect on the shape, density and velocity of the beam can be achieved by varying the potentials of the accelerating/ionizing structure as a function of distance from the emitter, for example. As already mentioned, other beam shaping and directing structures may be employed utilizing magnetic field control of beam shape and particle distribution.

Various arrangements and configurations of accelerating and beam directing elements may be employed to separate different particles in the beam so that bombardment of the specimens occurs only with the particles of desired size and velocity. Particular arrangements in accordance with the invention include structure for developing oriented magnetic fields which curve the desired particles along selected paths to the specimens while other particles that might have a deleterious effect upon the specimens being bombarded are directed along paths which impact shields or otherwise miss the specimens altogether.

The benefits provided by the present invention are particularly useful in developing suitable low-cost lenses for eyeglasses and other applications from materials and fabrication processes formerly unsuitable. For example, it now becomes practical to form lenses by injection molding processes with the lenses in the final fabrication step being coated with films implanted by means of the present invention.

Moreover, arrangements in accordance with the present invention may be used for implanting films on substances and articles other than plastic lenses. For example, one or a plurality of beam ionizing and accelerating arrangements in accordance with the present invention may be used on a mass production basis to implant a film having the desired properties of hardness, resistance to abrasion, and the like on a thin sheet of plastic or other material suitable for lamination with other sheets of plastic or the like to develop a desired combination of properties for an overall article. Such a laminated article may comprise an automobile windshield, for example, with the principal layer of the article being a thicker sheet of plastic having desirable properties of resistance to breakage and the like with the outer surfaces being covered with thin laminations of plastic implanted with a film in accordance with the present invention. The resultant article develops, by virtue of the implanted film, the necessary properties of hardness and resistance to surface abrasion which are not provided by the inner sheet constituting the principal material of the article.

Mass production of such a film may be accomplished by feeding a thin sheet passing between respective storage rolls through an evacuated chamber in which the beam accelerating and ionizing structures of the present invention are located. It may also be possible to treat fabrics of various type in similar fashion. It has been found that the implantation of a particular material as a film has a beneficial result insofar as improvement of fire resistant or fire retardant properties is concerned. It is believed that the implantation of such a film tends to prevent oxidation by keeping air from reaching the combustible material underneath. It may be possible to treat fabrics in such fashion to develop fire retardant properties. Materials which are useful for this purpose comprise minerals which are non-combustible and which present a very small temperature coefficient of expansion, thus permitting the film to avoid rupture and remain intact as a protective coating over a considerable temperature range. Where multiple constituents of the protective film are present, they may be selected to compensate for their respective temperature coefficients so that the coefficient of expansion overall is approximately stabilized. Thus, the application of heat does not have the effect of fracturing the implanted film. As long as the implanted film, which itself is non-combustible, maintains its integrity, the oxidizable material underneath is prevented from combination with oxygen.

DESCRIPTION OF THE DRAWING

A better understanding of the invention may be had from a consideration of the following detailed description, taken in conjunction with the accompanying drawing, in which:

FIG. 1 is a perspective view of a system in accordance with the present invention;

FIG. 2 is a perspective view of particle bombardment apparatus in accordance with the invention within the vacuum chamber shown in FIG. 1, with the cover removed;

FIG. 3 is a perspective view of one particular arrangement of the ionizing and accelerating structure utilized in the apparatus of FIG. 2;

FIG. 4 is a plan view of another type of accelerator structure which may be utilized in the arrangement of FIG. 2;

FIG. 5 is a sectional view, taken along the line 5—5 of FIG. 4;

FIG. 6 is a schematic plan view of an accelerator structure for use in apparatus of FIG. 2;

FIG. 7A is a section taken along the line 7—7 of FIG. 6, showing details of another type of accelerator structure;

FIG. 7B is a sectional view taken along the line 7—7 of an alternative accelerator structure;

FIG. 8 illustrates a particular product produced in accordance with the invention;

DESCRIPTION OF THE PREFERRED EMBODIMENTS

Figure 9:
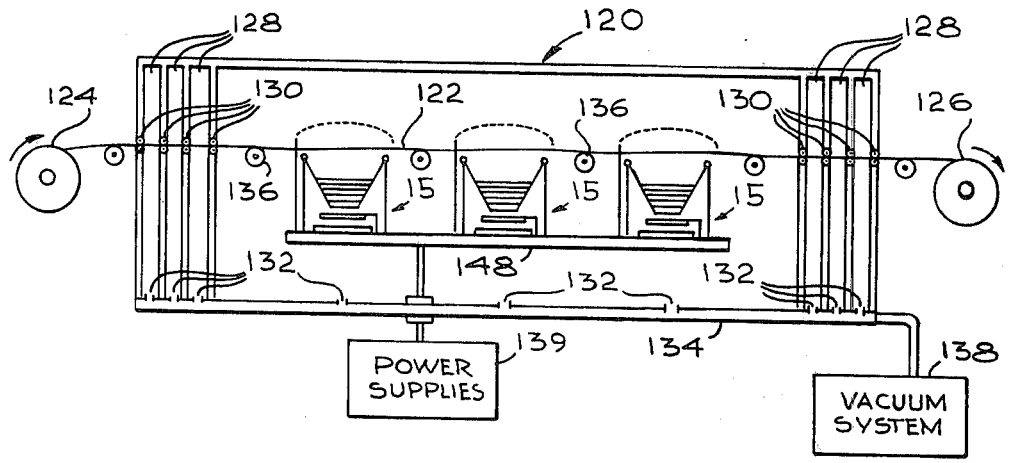
FIG. 9 is a combination schematic and block diagram of a further system in accordance with the invention.

As is shown in FIG. 1, a complete system 10 in accordance with the invention may comprise a high voltage power supply 12, a high vacuum system 14 and an RF power supply 16. The vacuum system 14 comprises a bell jar housing or cover 18 having one or more viewing windows 19 and a vacuum control console 20. Suitable interconnections between the various components of the overall system are provided via cables 22 and 24.

FIG. 2 depicts a bombardment apparatus mounted within the housing 18 of the vacuum system 14 of FIG. 1. The apparatus 15 is shown comprising upstanding frame support rods 30 mounted to a base plate ring 32 in position on the control console table 20. Recessed within the base plate ring 32 is an electron beam gun emitter 34, shown partially broken away in section. Such a unit may comprise a Model 2" SFIH-270° electron beam source with a Model CV-14 power supply, both of Airco Temescal Division of Air Reduction Company, Inc. and, as represented in FIG. 2, may be water-cooled by means of tubes 36 and have a centrally located target region 38 in which slug 40 of material to be evaporated is positioned. A filament (not shown) is positioned within the cavity 42. Suitable magnetic field generating coils are located within the structure adjacent the cavity 42. Various leads 44 are provided for carrying current to the filament and to the field generating coils. In operation of the electron beam gun emitter 34, electrons are emitted by the filament within the cavity 42 and directed outward and downward upon the target slug 40 under the influence of the generated electromagnetic field where they bombard and heat the slug 40 to cause emission of ionized molecular particles therefrom. A pivotable shutter 46, controllable from outside the vacuum housing, is provided to either block the cloud of emitted ionized particles or, alternatively when pivoted out of the way, to permit the ionized particles to respond to the field of the accelerating structure 48.

A specimen support or mounting frame 50 is shown mounted by means of insulators 52 atop the support rods 30. It is this frame 50 upon which the various articles, such as plastic lenses, may be secured for deposition of the film. A collector screen 54 is shown in position above the frame 50. It will be understood that the collector screen 54 is actually mounted to the top of the housing 18 (FIG. 1) but it is known in position here as it is normally located when the housing 18 is in position, for a more complete understanding of the apparatus. The potential of the screen 54 may be determined by connections (not shown) to the inside of the housing 18.

The accelerating/ionizing structure 48 is suspended from the support rods 30 by means of wires 60 and insulators 62. The details of the accelerator/ionizer 48 are better shown in FIG. 3. It will be seen to comprise a plurality of flat rings, increasing in both inner and outer diameter from bottom to top. The first, third and fifth rings 66 serve as guard rings and principally serve to isolate the field of the intermediate ionizing or emitting rings 68, although they may contribute to the electric field for particle acceleration and direction. An accelerating ring 70 is the uppermost ring in the structure 48. Thus, six rings are shown in the structure, although a greater or lesser number may be provided if desired. Adjacent rings are separated from one or another by means of insulators such as 72. The emitter rings are provided with a plurality of needles 74 spaced generally equidistantly about the rings 68, and soldered thereto, as by silver solder. The points of the needles 74 are sharpened to a fine degree and point radially inward. Thus, the points of the needles 74 readily emit electrons under the influence of an electric field which serves to further ionize the molecular particles that are being acted upon by the accelerator structure 48 and drawn toward the specimen/collector region by the positive potentials applied thereto.

The potential of the various elements of the apparatus of FIG. 2 may be controlled by means of conductors and feedthrough insulators 80 extending through the base plate ring 32. Thus, a conductor 82 is connected to the specimen frame 50. A conductor 84 is connected to a lower wire 60 to control the potential of the accelerating ring 70. Conductors 86 extend to respective ones of the guard rings 66, while the potential of the emitter rings 68 is controlled by conductors 88. These are connected to the associated high voltage power supply 12 and RF power supply 16 (FIG. 1).

In one particular mode of operation of the apparatus, radioactive isotope blocks 90 may be utilized to discharge the build-up of surface charge on the specimens being filmed through radioactive bombardment. Such radioactive isotope blocks may also be suitably positioned at other points within the housing 18 in locations suitable for effectively discharging the specimens, if desired. Alternatively microwave RF energy may be beamed at the specimens from suitably positioned slotted lossy wave-guide elements to produce a local plasma for discharging surface charge.

FIGS. 4 and 5 illustrate respectively plan and sectioned elevational views of one alternative type of accelerator/ionizing structure which may be substituted for that shown in FIGS. 2 and 3. This structure, designated 48A, comprises a plurality of rings 101, of which three are shown, electrically isolated from one another and from interconnecting vertical vanes 102 by means of insulators 103. The vanes 102 are angled to follow the contour of the inner diameters of the respective rings 101 and are sharpened to a fine razor edge along this portion of the vanes 102. The remainder of the structure is smooth, as by electropolishing. Thus the vanes 102 serve to emit electrons copiously along their sharpened inner edges under the influence of an electric field. Suitable connections (not shown) may be provided to control the potentials of the vanes 102 and rings 101.

FIG. 6 is a schematic plan view of accelerating structure 48 and FIGS. 7A and 7B are partial sectional elevations of alternative arrangements for the structure 48. FIG. 7A illustrates a plurality of tubular rings of which the emitter rings 104 have been fashioned with an extended and sharpened inner edge. The remainder of the rings 106 are perfectly rounded and electropolished to develop a smooth surface. The rings 104 under the influence of the applied electric field serve to discharge electrons inwardly from the sharpened inner edges.

FIG. 7B represents a structure similar to that shown in FIG. 3, except that the needles 74 have been eliminated and the two emitter rings 68A have been provided with a sharply honed inner edge to accomplish the emission of electrons inwardly under the influence of the electric field. The remainder of the rings 69 are smoothed, as by electropolishing, as are the other surfaces and edges of the rings 68 apart from the sharpened inner edge thereof.

Other accelerator and ionizing structural configurations may be devised to accomplish the results achieved by the accelerator/ionizer structure 48 and alternative arrangements shown and described herein. In particular, the structure may be substituted or modified by the inclusion of apparatus for generating magnetic fields, either in place of or in addition to the electric fields generated by certain of the elements herein shown, in order to accomplish the desired result of directing and shaping the particle beam to fit the particular specimen on which the film is being deposited.

FIG. 8 is a representation of a particular lens 110 which has been specially coated in the apparatus shown and described herein. Lens 110 on its left half 112 and the small circles 114 has been coated with an implanted film comprising principally minerals such as those referred to hereinabove selected for their properties of hardness, elasticity, heat resistance, and optical clarity. Except for the small circular areas 114, the right half 116 is uncoated. This was accomplished by first masking the right half 116 with a perforated foil layer before implanting the film. As a test, the lens 110 was then rubbed with various abrasive materials, including emery paper and steel wool. The coated areas 112 and 114 were unmarked by these abrasive materials and the lens remains clear and transparent in these areas. Over the remainder of the right half 116, however, the lens was severely scratched to the point where it was no longer transparent, as indicated by the stippling shown thereon. Similar experiments with soft lenses coated by other methods known in the art served to scratch and mar the lens face but did not affect the films and filmed lenses produced by the present invention.

Figure 10:
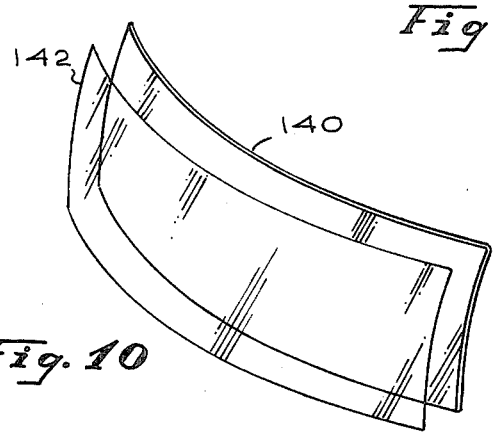
FIG. 10 is a view of elements of a particular product fashioned in accordance with the invention.

Various other uses besides the coating of eye glass lenses and the like may be realized from the practice of the present invention. FIGS. 9 and 10 illustrate another extensive area of use where the present invention will be most important. FIG. 9 illustrates a continuous system utilizing a plurality of particle bombardment units of the present invention arranged for a continuous film deposition process to implant a hard film on a cellulose plastic sheet. Facilities are known in the art for developing and maintaining a high vacuum chamber through which continuous materials may be fed for vacuum processing. The combination schematic and block diagram of FIG. 9 is intended to represent such a system. It is shown comprising a large chamber 120 through which a plastic sheet 122 is fed between rolls 124 and 126 at opposite ends of the chamber. Successive vacuum barriers 128 are provided at each end of the chamber 120. The film may be fed through suitable sealing arrangements 130, here represented as rollers between which the sheet 122 passes in going between outside ambient pressure and the high vacuum inside the chamber 120. Air passages or ports 132 are provided to connect the various regions within the chamber 120 with a plenum chamber 34 which is maintained at a high vacuum by an associated vacuum system 138. Alternatively the reels 124, 126 may be positioned within the chamber 120, in which case the need for the sealing elements for admitting the plastic 122 through the chamber walls is unnecessary. Within the chamber 120 and adjacent the sheet 122 which is supported on rollers or guides 136 is shown a plurality of units 15 (FIG. 2) mounted on a base 148. These units 15 are shown as being connected to a power supply unit 139 which may include both the high voltage power supply and RF generator supply used in the system of the invention.

In operation of the system represented in FIG. 9, the sheet 122 is transferred from roll 124 to roll 126, passing through the vacuum chamber 120 and past the ionized particle deposition units 15. One or more of the units 15 may be operated to implant the desired film on one or both sides of the sheet 122 so as to develop the film in the desired areas and to the desired thickness. If deposition on both sides of the sheet 122 is desired, it can easily be arranged, either by mounting additional units 15 on opposite sides of the sheet (possibly by using deflecting fields to develop the desired particle trajectories) or simply by doubling back the sheet 122 so that it traverses one or more of the units 15 with the opposite side of the sheet in position to be bombarded by the ionized particles therefrom.

An outstanding benefit of implanting film on plastic sheet in this fashion is the opportunity which develops for fabricating a variety of articles which have heretofore been limited to fabrication from glass because of the need for surface protection by providing extreme resistance to abrasion. One such item is the automobile windshield. Such is represented in FIG. 10 as being formed of plastic sheet, preferably injection molded to a suitable thickness and shape, to which a sheet 142, cut from a sheet 122 which has been implanted with a hard film in accordance with the invention as described in connection with FIG. 9, may be bonded. In FIG. 10, only one such sheet 142 is shown in conjunction with the base layer 140, although it will be understood that a sheet 142 may be provided on each side of the base layer 140.

Figure 11:
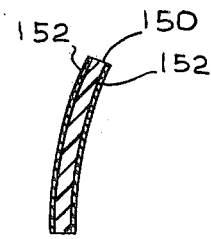
FIG. 11 is a view in section of another product of the invention.
Figure 12:
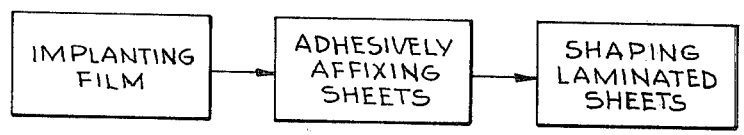
FIGS. 12, 13 and 14 are block diagrams illustrating various methods in accordance with the invention.
Figure 13:
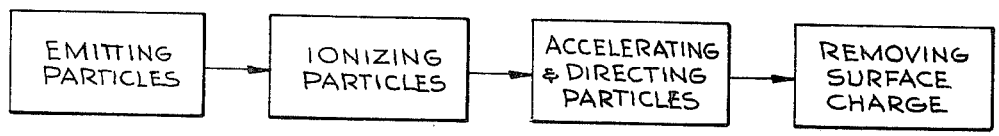

FIG. 11 represents a cross-section of an article, such as the windshield of FIG. 10 or an injection-molded lens, for example, in which a base layer 150 is laminated between two layers 152. Each of the layers 152 is implanted with a hardened film in the manner described hereinabove along its outer surface. Thus, the laminated structure will provide the desired combination of toughness and resilience that may correspond to the base layer 150 and still provide the resistance to abrasion along all surfaces that are subject to abrasive forces as is provided by the protective film implanted in the manner described herein. One method of producing such an article is illustrated in FIG. 12. The more generalized methods of operating apparatus in accordance with the invention as described in conjunction with FIGS. 1-7 and 9 are illustrated in FIG. 13.

Figure 14:
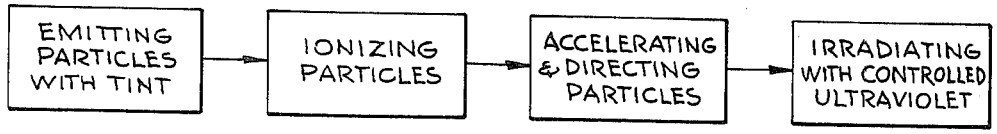

Thus far the invention has been described in the context of deposition of a clear transparent film on a plastic substrate. However, it will be understood that other films may be deposited and that the substrate need not necessarily be plastic or, indeed, non-conducting. Various materials or compositions may be used as a source of the particles for deposition. One type of particular interest for sunglasses and windows for filtering the sun's rays is the deposition of a colored film. This may be accomplished by the inclusion of the oxides or other substances which impart the desired color to the film as deposited. Since the colors and tints achieved thereby have a tendency to fade, proportionally on exposure to ultraviolet light, it is desirable to implant a film of a deeper shade, color or tint than that which is ultimately desired and thereafter by exposure to ultraviolet rays or a similar treatment fade the deposited film to the intended hue. With controlled rates of deposition of a colored film, the ultraviolet rays which are present in the plasma during the deposition process may develop the desired fading so that the ultimate level of tinting is already present when the deposition process is completed. Such methods are illustrated in FIG. 14.

Figure 15:
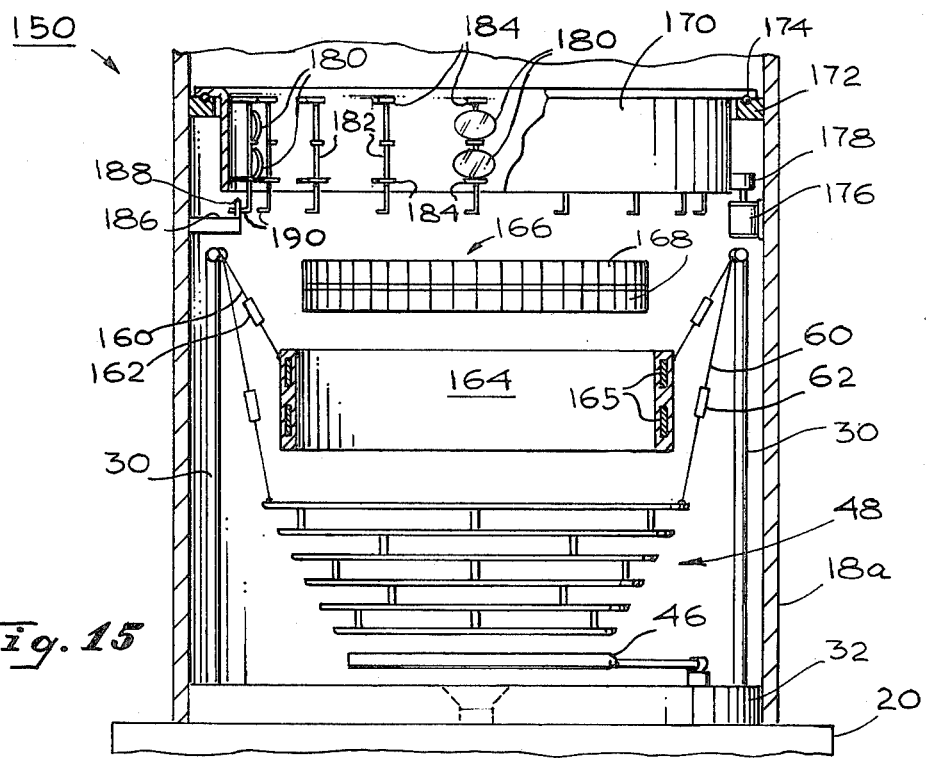
FIG. 15 is an elevational view, partially in section and broken away, of another arrangement in accordance with the invention for use in the system of FIG. 1.

An alternative arrangement in accordance with the present invention for use in the system of FIG. 1 is illustrated in FIG. 15, which is a partial elevational view showing the details of particular features, partially in section and partially broken away. In FIG. 15, apparatus 150 is shown having many of its basic structural elements similar to the structure of the apparatus 15 of FIG. 2; and where corresponding elements of structure are shown, the same reference numerals are employed. Thus, the apparatus 150 is shown comprising a base 32 mounted on a table 20, a combination accelerating and ionizing structure 48 suspended by wires 60 and insulators 62 from support members 30, a shutter 46 mounted for pivotal movement above the base 32, and a bell jar cover 18a corresponding to the bell jar 18 of the vacuum apparatus of FIG. 1.

In the configuration of FIG. 15, while the ionized particle beam is generated, accelerated and ionized in the same fashion as with the apparatus of FIG. 2, the beam is subsequently directed through a curved path to impact the mounted specimens. The purpose of directing the beam in such fashion is to achieve a separation of particles of various sizes and weights, thus avoiding a deleterious effect on the specimen being coated which might be caused by the impacting of larger particles that are sputtered off the material which is the source of the film particles. It has been found that the impact upon the specimens being filmed of relatively large particles tends to produce pitting of the implanted film. As a consequence, the film is fractured or the larger particles are embedded in the specimen and there is a tendency for absorption of moisture with a consequent lifting of film in the vicinity of the pits. In an extreme case the larger particles may develop undesirable surface irregularities. It has been found that the tendency to emit larger particles along with the smaller ones which are desired for the implanting process is diminished if the material comprising the source of the film is heated to a molten form before emission is initiated. However, applying this much heat to the system has an adverse effect in cases where the specimens are plastic or some other soft material since the heat tends to soften and melt the specimens and spoils the entire process.

A preferable arrangement for overcoming this problem is represented in FIG. 15 wherein the apparatus 150, in addition to comprising the elements already mentioned, includes means for establishing particularly oriented magnetic fields for directing the smaller particles to the specimens that are placed out of the path of the larger particles. This apparatus is shown additionally comprising a cylinder 164 containing magnetic field coils 165 for establishing a vertically directed magnetic field. The cylinder 164 is suspended from the support rods 30 by means of wires 160 and insulators 162. Above the cylinder 164 is shown a second magnetic field means 166 for establishing a magnetic field which is horizontally directed. Means 166 may comprise individual magnets 168 which may be in the form of permanent magnets or the magnets 168 may be the pole pieces of electromagnetic coil magnets. In one configuration, means 166 may be in the form of a generally flat plate mounted to the wall of the housing 18a on the far side thereof, with a corresponding magnetic field means of opposite magnetic polarity (not shown) on the near side of the beam path through the center of the housing 18a.

Above the magnetic field producing apparatus is an arrangement for suspending the specimens about the sides of the housing 18a. This mechanism is represented as a cylinder 170 having an extended upper lip adapted to be supported on a ring 172 by means of ball bearings 174 to permit rotation of the cylinder 170. A motor 176 with a drive roller 178 bearing against the cylinder 170 serves to drive the cylinder 170 in rotation within the housing 18a. Specimens in the forms of lenses 180 are shown positioned on mounting racks 182 pivotably mounted in supports 184. The racks 182 are arranged to be pivoted through 180° at a particular point in the cycle of rotation of the cylinder 170 in order to rotate the lenses 180 relative to the cylinder 170 so that they may be coated on both opposite surfaces. As shown in FIG. 15, this pivoting mechanism comprises a block 186 having a rod 188 extending to engage a trip lever 190 at the lower ends of the racks 182. Thus as each individual rack 182 passes the rod 188, the trip lever 190 is engaged by the rod 188 and caused to rotate so as to turn the lenses 180 around and expose the other side to bombardment on further rotation of the cylinder 170.

In the operation of the apparatus of FIG. 15, emitted particles are accelerated and ionized by means of the apparatus 48 as already described in connection with FIG. 2. As the particle beam passes through the apparatus 48, the larger particles pick up a lesser negative charge in proportion to their mass than do the smaller particles. In fact, the particles may have a positive charge upon emission which, in some instances, is not even neutralized by the emitted electrons during passage of the particles through the apparatus 48. As is known, the ballistic trajectory of a charged particle through a magnetic field may be dependent on the charge-to-mass ratio. Particles having a larger charge-to-mass ratio are deflected more by an orthogonal magnetic field than particles which have zero net charge or a smaller charge-to-mass ratio. Thus, the magnetic field directing and deflecting means of FIG. 15 serve to separate the particles which are larger than desired and those which are inadequately ionized from the particles of proper size and ionization to produce the desired film implantation on the lens specimens 180.

For apparatus such as is shown in FIG. 15, a collector and suitable surface charge discharging means may be positioned across the top underneath the dome of the housing 18a in the manner indicated in FIG. 2. Such a collector, in addition to being effective as an element establishing an electrostatic field, may also serve to collect and trap the charged particles of larger size or lesser charge-to-mass ratio which are not directed by means of the magnetic field of the magnetic field means 166 to the specimens 180. As an alternative to the arrangement as depicted in FIG. 15, the specimens may be mounted in the manner shown in FIG. 2 with magnetic field deflecting means such as a baffle being provided to cause the particles to follow a dog-leg curved path which ultimately directs the appropriate particles to the specimen while deflecting or trapping the undesired particles outside the region of the specimens being implanted.

An another alternative to the arrangement represented in FIG. 15 wherein the specimens are physically revolved by the cylinder 170 about the interior of the housing 18a during the film deposition process, the position of the specimens 180 may be fixed by holding the cylinder 170 stationary and the magnetic field of the magnetic field means 166 may be rotated to cause the particle beam to sweep the specimen area. In such case, the magnetic field means 166 may itself comprise a cylindrical ring with the individual magnet field elements 168 being selectively magnetized by electromagnetic fields established by selective and successive energization of the respective electromagnetic coils to develop a horizontal magnetic field which rotates in controlled fashion in a plane generally orthogonal to the longitudinal axis of the apparatus 150. Such a swept field may selectively film any particular specimen as desired. At the same time it is effective in the manner already described at separating the desired particles from the undesired particles in order to provide an improved resultant filmed product. Also, if desired, the structure comprising the mounting racks 182 may be electrostatically charged so that these racks 182 serve additionally as a collector to attract the charged particles passing through the accelerating and ionizing structure 48 and the magnetic field means 164, 166.

Figure 16:
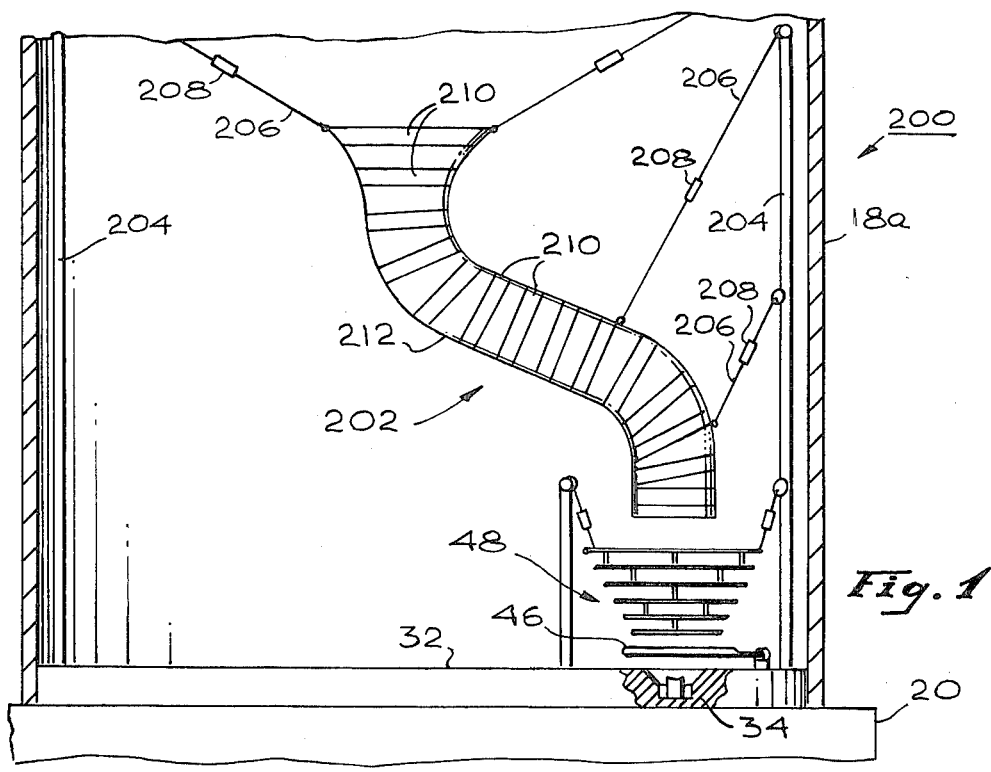
FIG. 16 is a similar view of yet another arrangement in accordance with the invention.

Still another embodiment of the invention is represented in FIG. 16 which shows apparatus 200 such as may be employed in the system of FIG. 1. Apparatus 200 is similar to that shown in FIG. 2 with certain notable modifications. As shown in FIG. 16, the apparatus 200 comprises the vacuum chamber within a housing 18a having a table 20, a base 32, a particle emitter 34, a shutter 46 and the ionizing, accelerating and directing structure 48. The elements 34, 46, and 48 are positioned off-center within the vacuum chamber of the apparatus 200. Above the elements 34, 46 and 48, and aligned therewith, is a particle diverting and directing structure 202 suspended from support rods 204 by means of wires 206 and insulators 208. As shown in FIG. 16, the structure 202 includes a plurality of toroidal ring magnets 210 mounted within an outer housing or baffle 212. The respective ring magnets 210 are successively positioned along the intended path of the selected ionized particles and so oriented as to direct the particles by means of an electromagnetic field from the vicinity of the apparatus 48 upward and sideways to establish a stream of ionized particles generally centrally located and symmetrically disposed about the longitudinal axis of the housing 18a. The baffle or shield 212 is so arranged as to prevent any line-of-sight path from the structure 48 to the specimens above the apparatus 200. In this arrangement in accordance with the invention, the upper portion of the apparatus may correspond to the upper part of FIG. 2 with the specimens symmetrically disposed across the upper end of the chamber 18a. In this arrangement, the particles which do not have the appropriate velocities and charge-to-mass ratio will not follow the same path through the apparatus 202 as do the selected particles, but instead will tend to impact the baffle or shield comprising the housing 212 and thus be removed from the stream of ionized particles directed toward the specimens at the top of the apparatus.

Although FIG. 16 shows the diverting and directing apparatus 202 as including a plurality of ring magnets 210, it will be understood that this structure may be formed of a single solenoidal coil in place of the individual magnets 210. Alternatively a plurality of permanent magnets, suitably fixed in a series of rings, may be used as the magnets 210. Such an arrangement has the advantage of developing the desired particle-diverting field without the application of electrical power, thus reducing the power requirements of the apparatus 200 and avoiding the heat otherwise generated within the housing 18a by the electromagnet system.

Apparatus in accordance with the present invention may also be utilized to implant metal surfaces with desired compounds. Certain compounds may have the effect of changing the surface properties of the metallic article, similar to the hardening provided for plastic lenses and the like already described. In other circumstances, apparatus in accordance with the present invention may be utilized to implant surface films on selected portions of semiconductors in order to facilitate the fabrication of entire solid state circuits on single semiconductor chips. Various other applications of the methods and apparatus of the present invention will occur to those skilled in the art without departing from the concepts of the invention.

Thus, there have been described and shown herein various particular arrangements in accordance with the present invention which illustrate the application thereof to a variety of uses. Variations of the structures shown and described herein, all within the basic concept of the invention, will occur to those skilled in the art. For example, other configurations of ionizing elements may be employed, as for an example the use of specific electron guns for directing electrons into the particle stream for further ionization thereof.

Although there have been described above specific methods and apparatus for depositing film on a substrate, and products produced thereby, in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention.

What is claimed is:

1. The method of fabricating a composite plastic product having at least one hardened outer surface comprising the steps of:
    preparing a relatively thin, flexible plastic sheet by implanting a hardening film on at least one side of the sheet, said implanting step including placing the sheet in a vacuum chamber in a position to be bombarded along one surface by an ionized particle beam, which vacuum chamber is equipped with an electron beam source for vaporizing material to comprise said implanted film, directing the ionized particle beam from the source to bombard the plastic sheet, and applying electrical potentials to accelerating and ionizing structure imposed between the source and the sheet to further ionize the particles in said beam by field emission of charges from the ionizing structure;
    removing the thin plastic sheet with the implanted film thereon from the vacuum chamber;
    preparing a relatively thick sheet of plastic in the form desired for said product, which thick sheet of plastic has the desired physical properties of said product except that of surface hardness;
    affixing said thin plastic sheet along one surface of the thick plastic sheet so that the surface with the implanted film faces out; and
    shaping the composite product to the desired dimensions thereof.

2. The method of claim 1 further comprising controlling the particle beam to implant the hardening material to a selected depth within a range from several hundred Angstroms to a few microns.

3. The method of claim 2 wherein the selected depth of implantation is approximately one micron.

4. The method of claim 2 or claim 3 further including the step of continuing the bombardment of the surface until a film layer is built up to a thickness of approximately two microns on said surface.

5. The method of claim 1 further including preparing a second thin flexible sheet by repeating the steps of preparation of the first-mentioned thin, flexible sheet and affixing the second sheet to the second side of the relatively thick plastic sheet with the hardened surface facing outward, away from the thick plastic sheet, prior to the shaping step.

6. The method of claim 1 wherein the composite article is a vehicle windshield.

7. The method of claim 1 wherein the composite article is a spectacle lens.

* * * * *